United States Patent [19]

White

[11] Patent Number: 4,468,309

[45] Date of Patent: Aug. 28, 1984

[54] METHOD FOR RESISTING GALLING

[75] Inventor: Gerald W. White, Dallas, Tex.

[73] Assignee: White Engineering Corporation, Dallas, Tex.

[21] Appl. No.: 487,749

[22] Filed: Apr. 22, 1983

[51] Int. Cl.$^3$ ............................................ C23C 15/00
[52] U.S. Cl. .............................. 204/192 N; 204/298; 427/38; 427/39
[58] Field of Search .................................. 204/192 N

[56] References Cited

U.S. PATENT DOCUMENTS

| | | | |
|---|---|---|---|
| 3,806,380 | 4/1974 | Kitada et al. | 204/192 N |
| 3,857,682 | 12/1974 | White | 29/195 |
| 3,925,116 | 12/1975 | Engel | 204/192 N |
| 4,016,389 | 4/1977 | White et al. | 204/192 N |
| 4,054,426 | 10/1977 | White | 51/309 R |
| 4,116,791 | 9/1978 | Zega | 204/192 N |
| 4,181,590 | 1/1980 | Fujishiro et al. | 204/192 N |
| 4,342,631 | 8/1982 | White et al. | 204/192 N |

OTHER PUBLICATIONS

Spalvins, Lubrication Engineering, Feb. 1970, pp. 40–46.
Mattox, J. Vac. Sci. Tech. 10 (1973), pp. 47–52.
Ohmae et al., Proc. 6th Intern. Vacuum Congress, Japan, J. App. Phy. Supp. 2, Pt. 1, 1974, p. 457.
Aronson et al., Thin Solid Films 72 (1980), pp. 535–540.
Lapedes, McGraw-Hill, Dictionary of Scientific and Technical Terms, 2nd Ed., 1979, pp. 645, 657, 1502–1503, 1661.

Primary Examiner—Arthur P. Demers
Attorney, Agent, or Firm—Richards, Harris & Medlock

[57] ABSTRACT

A method for resisting galling of two coacting threaded members (10, 16) is provided. The method includes depositing a material film (36) by high energy level ion plating onto the machined surfaces (12, 14) of at least one of the threaded members (10, 16) for providing a thin mechanically insulating film (36) on the threaded member (10, 16) having a low shear stress value.

30 Claims, 7 Drawing Figures

METHOD FOR RESISTING GALLING

TECHNICAL FIELD

This invention relates to antigalling methods, and more particularly to antigalling methods for threaded connectors which have a high tendency to gall when being made-up or broken-out.

BACKGROUND ART

Galling is a form of adhesive wear which is most damaging at relatively high stresses. Seizure of mating components is frequently a result of severe galling and usually takes place early in the life of equipment. Threaded components are particularly noted for their seizure tendencies.

When two surfaces are loaded together, the coacting surfaces may form strong bonds due to the locally high pressure and heat generated by subsequent motion. If these bonds sever at the interface, little damage occurs and the parts run smoothly; on the other hand, if fracture occurs in either material, gross damage results. This damage is termed galling.

In the past, organic and inorganic lubricants have been employed to resist galling failure. Common methods previously employed have included metallic electroplatings of tin and/or zinc, which may cause serious environmental waste disposal problems. Phosphate conversion coatings have also been used which also have environmental disposal problems and are limited to the type of material substrate to which it can be applied. Base lubricant films, such as API modified thread compound commonly used on threaded connectors allow slippage between moving parts as long as the moving parts are not chemically, thermally, or physically destroyed or displaced. However, after the lubricant is penetrated, cold welding of the active surfaces in contact with each other begins. Cold weldings result in the destruction by galling of the mating surfaces.

A need has thus arisen for a method for resisting galling of coacting metal-to-metal surfaces, whether they be sealing surfaces, shoulders or thread elements.

DISCLOSURE OF THE INVENTION

In accordance with the present invention, a method is provided for substantially eliminating the galling problems heretofore associated with the repeated making-up and breaking-out of threaded connectors.

In accordance with the present invention, a method for resisting galling of two coacting threaded members is provided. The method includes depositing a material film by high energy level ion plating onto the machined surfaces of at least one of the threaded members providing a thin mechanically insulating film on the threaded member having a low shear stress value.

In accordance with another aspect of the present invention, a method for resisting galling of two coacting male and female threaded members is provided by depositing a material film by high energy level ion plating on the machined surfaces of each member providing a thin film on each of the coacting metal-to-metal surfaces of a low shear stress value for separating and insulating the active atomic lattice structures of the coacting metal-to-metal surfaces from each other when the members are joined together to thereby resist galling.

In accordance with yet another aspect of the present invention, a method for resisting galling of threaded members includes providing a thin film of mechanically insulating materials on the machined surfaces phased into the base material of the threaded member of an intervening thin film phased into the base material of the threaded member as an integral part of the substrate atomic lattice.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION

While the present invention is useful for resisting galling of threaded connectors in many different applications, the problem of galling of threaded connectors is particularly common in the oil and gas industry in connecting and unconnecting production tubing. In particular, galling is a major problem in high alloy stainless steel and nickel base alloy oil country tubular goods, which are needed to overcome corrosive conditions in a well bore.

Figure 1:
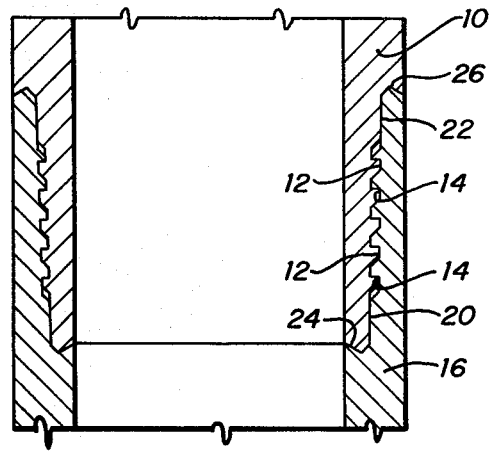
FIG. 1 is an enlarged sectional view of the threaded connection on two tubular members.

Referring to FIG. 1, a male tubular member such as pipe 10, is shown having threads 12 which coact with threads 14 on a coacting female tubular member, such as pipe 16. The threaded connection between pipes 10 and 16 includes planar areas 20 and 22 and sealing areas 24 and 26. While a particular threaded configuration shown in FIG. 1 is illustrated, the present invention is directed to any type of threaded connection. While galling may occur between any part of the threaded connection, the sealing areas 24 and 26 are typically the worst points for galling failure.

One aspect of the present invention is directed to depositing a metal film which is phased into the surface of the metal threads 12 and 14 in addition to planar areas 20 and 22 and sealing areas 24 and 26. The metal film is deposited as an integral part of the substrate atomic lattice with a uniform coverage and thickness by high energy deposition of atomic sized particles of the desired functional materials. The material film may comprise, for example, any of the softer metals, such as, for example, gold, silver, lead, tin, indium, palladium or copper, having the properties of low friction, good adhesion and low shear strength which may be deposited by the high level ion plating process in a thin film directly bonded to the full machined thread profile. In particular, the present method comprises the providing of a thin film treated machined profile having one or more surface films deposited on its outer surfaces by a high particulate energy level ion plating process. Additional types of soft films may be utilized such as, for example, layered lattice inorganic compounds such as molybdenum disulfide.

Additionally, where a corrosive resistant alloy is utilized in the pipes 10 and 16, it may be desirable to provide one or more interfacial films of hard material such as chromium, titanium or various hardened refractory materials such as metal carbides, metal nitrides, ceramic materials or cermats. In those instances, the outer surface of the harder materials blend a layer of the softer mechanically insulating films so that lubricity is imparted to the harder initial coating layer.

Figure 2:
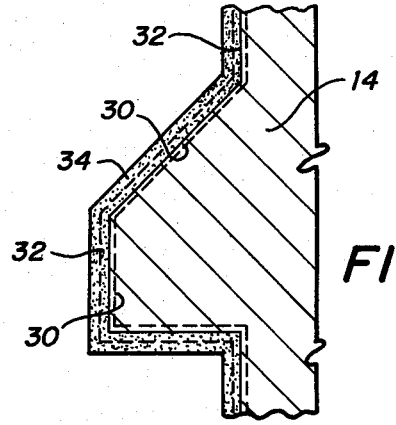
FIG. 2 is an enlarged sectional view of a thread of one of the tubular members shown in FIG. 1 which has been coated in accordance with one aspect of the present invention.

Referring now to FIG. 2, an enlarged sectional view of thread 14 is illustrated showing the phased alloy buildup of a thin protective film and an outer film, both deposited by high particulate energy level sputtering or ion plating processes. At the onset of a deposition, the initial ions arrive under an electrical charge acceleration and bury into the substrate lattice structure 30. As the buildup continues, for example, using a hard metal such as, for example, chromium, a thin layer 32 is deposited to provide strength and durability to the surface of thread 14. As the buildup further continues, the phasing of materials begins with the percentage of the hard underlying material thin layer 32 steadily diminishing accompanied by an increase in the percentage composition of an outer material layer 34, such as, for example, gold. The total thicknesses of the combined layers 32 and 34 may be in the range of 10,000 to 12,000 angstroms. The thickness of material layer 34 may comprise, for example, approximately 2,000 angstroms. Alternatively, if desired, multiple layers may be utilized such as, for example, an inner layer of titanium, a second layer of titanium carbide and an outer layer of titanium nitrate.

Figure 3:
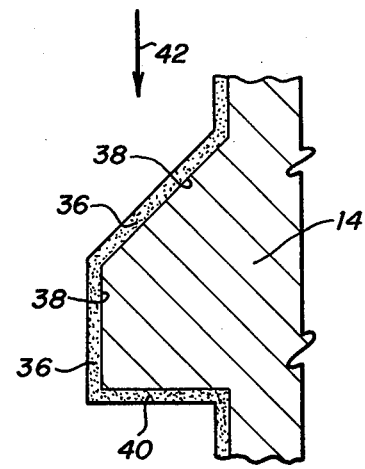
FIG. 3 is an enlarged sectional view of a thread of one of the tubular members shown in FIG. 1 which has been coated in accordance with another aspect of the present invention.

Referring now to FIG. 3, the coating of thread 14 with a single film coating is illustrated. The single film coating may be utilized in applications where galling is less severe than the need for multiple layer coatings illustrated in FIG. 2. A single element film of any suitable material layer 36 may be utilized by applying material layer 36 to the thread 14 by a high particulate level ion plating process. It has been found that single coatings of copper, indium or gold have allowed tool joints to be made up and broken out ten times as compared to one half times for uncoated tool joints.

Additionally, to further enhance the adhesion of layer 36 to thread 14 or to overcome problems associated with weak affinity of material layer 36 to thread 14, a thin layer 38 of approximately 2,000 angstroms of mutually active material such as, for example, nickel, is beneficial. The uniform, three dimensional coating characteristic of ion plating allows layer growth on a surface 40 even though surface 40 is hidden from the direction of the plating stream indicated by arrow 42.

Figure 4:
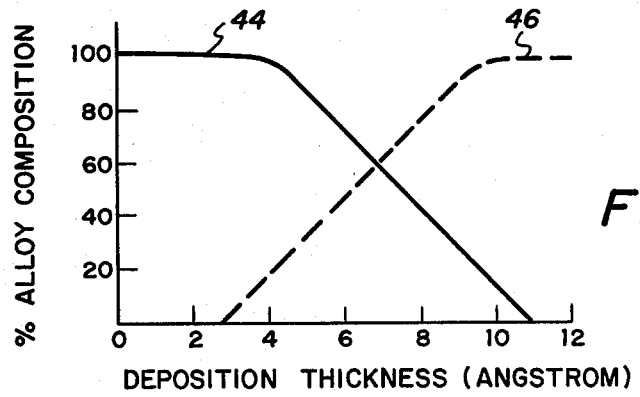
FIG. 4 is a graph illustrating how the composition of the coatings of the present invention change with multiple coatings.

FIG. 4 illustrates a plot of percent alloy composition versus deposition thickness for a material A, line 44 and a material B, line 46. Material A may comprise, for example, a chrome layer 32 (FIG. 2) and material B may comprise, for example, a gold layer such as layer 34 (FIG. 2). For the first 4,000 angstroms of thickness, layer 32 is substantially harder. As the deposition continues, the percentage of the softer material B of layer 34 begins and increases while the amount of material A, layer 32, decreases. At the outer 2,000 angstroms of thickness, the film is substantially all soft material such as gold layer 34.

The thin layers applied to pipes 10 and 16 can be applied by several different processes such as, for example, chemical vapor deposition, vacuum evaporation also referred to as physical vapor depositions, sputtering including radio frequency, direct current and various magnetron versions and ion plating as illustrated in U.S. Pat. No. Reissue 30,401.

An important aspect of the present method is the provision of an improved ion plating process using high particulate energy levels afforded by the ion plating process for plating substrates such as pipe threads with a wide variety of material at high deposition rates. The process of the present invention provides for a high energy flux to the substrate surface providing a high surface temperature enhanced diffusion and chemical reactions without requiring bulk heating, altering the surface and interfacial structure, or physically mixing the film during film deposition. Ion plating offers fast deposition rates allowing thin film work in terms of millimeters rather than angstroms. The increased throwing power imparted to the ions advantageously facilitates coating larger irregular shaped objects, internal diameters or convolutions with a uniformly deposited film in a range from extremely thin to thick films in the millimeter range.

Figure 5:
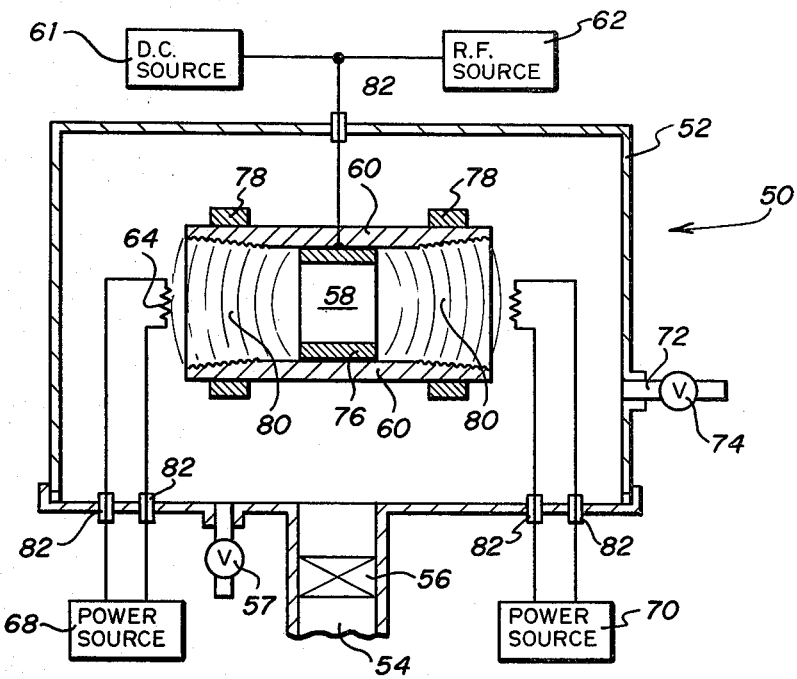
FIG. 5 is a schematic diagram illustrating the use of ion plating for carrying out the method of the present invention.

The improved ion plating system of the present invention is illustrated in FIG. 5 which includes a vacuum plating system with an evaporant source wherein the evaporant atoms are ionized by electron collision when passing through a magnetic field to the substrate for converting the material to be plated into the substrate into the plasma state in the area of the substrate. An ion plating system for use with the present invention is generally indicated by numeral 50. System 50 includes a chamber housing 52 suitable for providing a vacuum therein. Chamber housing 52 may be vertical or horizontal and may be comprised of any suitable material for maintaining vacuum pressure. Chamber housing 52 includes an outlet 54 controlled by a valve 56 which leads to a pump (not shown) for vacuum evacuation of chamber housing 52. System 50 may be brought back to atmospheric pressure by utilizing a valve 57.

A fixture 58 is provided in chamber housing 52 for holding one or more articles of substrate 60 to be coated. As illustrated in FIG. 5, substrate 60 comprises the internal threads of a pipe coupling. A DC power source 61 and an RF power source 62 are provided and are connected to fixture 58 for attracting positive ions toward substrate 60 from a material vaporization source. The vaporization source may be of any suitable source that may vaporize plating material, such as, for example, a refractory bolt, an electron beam gun, an induction heated crucible, electric arc, or as illustrated in FIG. 5, one or more electric filaments 64 and 66 which are in turn connected to power sources 68 and 70, respectively. Two such vaporization sources 64 and 66 may be utilized for the deposition of different materials and deposition at different time periods.

A gas supply conduit 72 controlled by a metering valve 74 is connected to chamber housing 52 whereby input gas may be injected into chamber housing 52. The input gas may be inert or other gasses conducive to performing specific functions such as, for example, inert gas ion bombardment cleaning of the substrate 60 prior to the plating process or collision scattering of the evaporant atoms to enhance uniformity of coating three dimensional objects. RF generator 62 is provided for this latter purposes as RF sputtering generally cleans better than the cleaning action of a DC source. Additionally the input gas may be a metal bearing gas plasma for producing high metal penetration.

Fixture 58 includes one arm or magnet 76 which may comprise, for example, permanent magnets or electro magnets and magnets 78 for establishing a magnetic field 80 adjacent substrate 60, such that evaporant atoms passing through the electrons that are spiraling in magnetic field 80 become ionized by collision with electrons and are immediately attracted to the high negative potential generated by the negative charge of power source 61. All connections made to the interior of chamber housing 52 are made through insulators 82.

In operation of the method for carrying out the present invention, the high energy level ion plating system 50 illustrated in FIG. 5 is evacuated through outlet 54 to a suitable vacuum, such as, for example, approximately $1 \times 10^{-4}$ millimeters of mercury. If it is desired to have a cleaning procedure for substrate 60 for chemical or physical reasons, gas may be introduced into housing chamber 52 through conduit 72, for example, at a pressure of ten to twenty microns and a radio frequency plasma formed by the gas will bombard the surface of substrate 60 advantageously to effectuate cleaning. After cleaning, the gas will be withdrawn from the evacuated housing chamber 52 prior to initiating the plating process.

A direct current negative bias, for example, 3 to 5 kilovolts from power source 61 may be applied to fixture 58 which acts as a cathode to attract positive ions towards substrate 60 by attraction through a high voltage drop. Plating begins when one or both material electric filaments 64 or 66 are heated to a temperature high enough to vaporize the plating material. Where sources 64 and 66 are resistence heated sources, a low voltage, high current alternating current power supply 68 and 70 are utilized.

Magnets 76 and 78 provide a magnetic field 80 to thermonic electrons from the evaporant causing these electrons to spiral and thus offer a dense ionization cross section to atoms of evaporant material passing through the cloud on the way to substrate 60. Thus ionization is at a maximum in the region of substrate 60 where the need is greatest. Either or both of the resistant electric filaments 64 or 66 may be utilized by varying the power input from power supplies 68 and 70 to filaments 64 and 66, respectively, to provide one or more material films or layers onto substrate 60.

Figure 6:
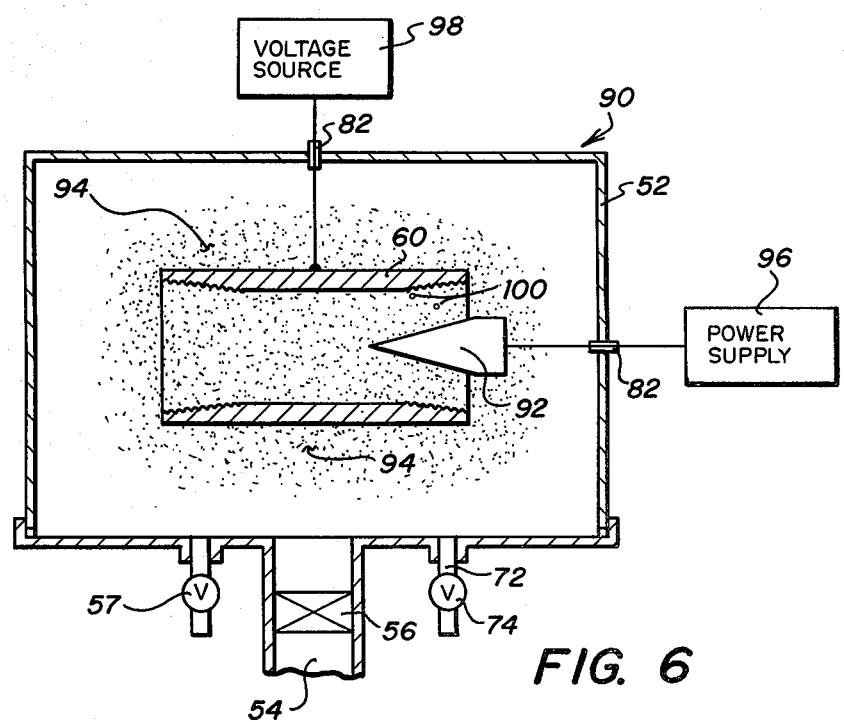
FIG. 6 is a schematic diagram illustrating the use of sputtering for carrying out the method of the present invention.

While the apparatus for carrying out the method of the present invention has been described in connection with a conventional ion plating system 50, additionally, a sputtering technique may also be utilized. FIG. 6 illustrates a sputtering system generally identified by the numeral 90 having like and corresponding components previously identified with respect to FIG. 5 of the ion plating system 50. Sputtering plating system 90 includes a cathode 92 of plating material. Substrate 60 is placed in an inert plasma 94 which is maintained by power supply 96. Power supply 96 may comprise an RF or DC source. Substrate 60 may be maintained at a ground potential or a negative value by voltage source 98. positive ions 100 of inert gas plasma 94 bombard the negative cathode surface of cathode 92 and, by collision, knock out atoms of the cathode 92 material, some of which cross over to plate substrate 60.

While the apparatus illustrated in FIGS. 5 and 6 for carrying out the method of the present invention for conventional ion plating (FIG. 5) and sputtering plating (FIG. 6) is useful for coating short length threaded products, such as couplings, these apparatii are not practical for a chamber housing 52 having a vacuum system to totally enclose the usual full length of an oil country tubular which is generally 30–40 feet long. An additional aspect of the present method is the provision of an ion plating system for depositing a material film or layer onto the machined profiles of an elongated tubular member such that it is not necessary to build a vacuum system long enough to totally enclose the tubular member. The plating process is provided such that only the necessary machined profile of the pipe is required to be enclosed in a vacuum. Further, one or more threaded members of the pipe may be coated simultaneously and the pipe may be rotated to enhance film uniformity.

Figure 7:
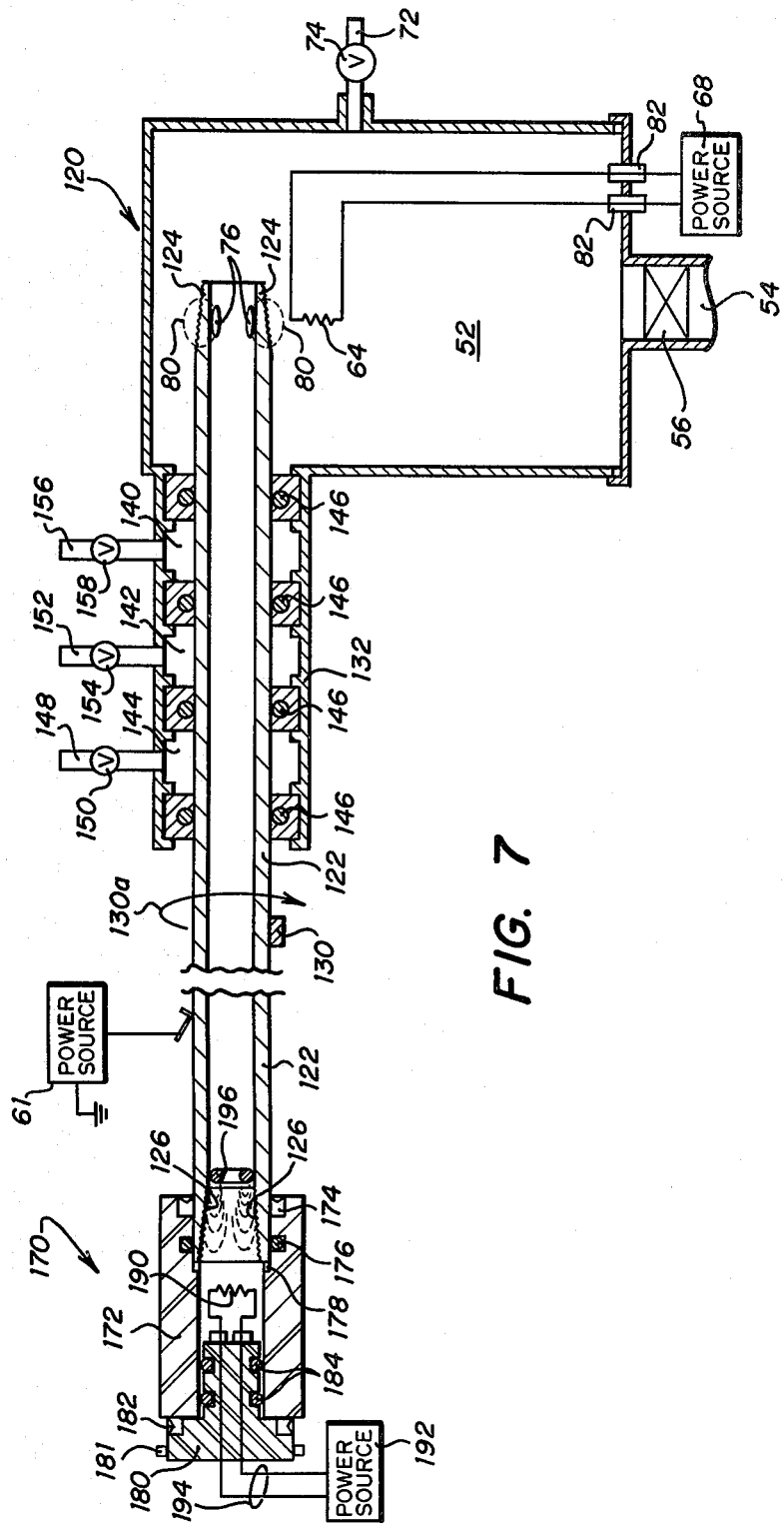
FIG. 7 is a schematic diagram illustrating a system using the present invention for coating threaded members of an elongated tubular member.

Referring now to FIG. 7, a pipe thread coating system 120 is illustrated in which a pipe 122 having machined profiles 124 and 126 can be simultaneously coated. Although a single pipe 122 has been illustrated, it will be understood that the system illustrated in FIG. 7 can also be used for the simultaneous coating of multiple pipes 122. Like reference numerals will be utilized in FIG. 7 for like and corresponding components previously identified with respect to FIGS. 5 and 6.

Chamber housing 52 is provided into which machined profile 124 of pipe 122 extends. Chamber housing 52 includes an outlet 54 having a valve 56 therein which is connected to a vacuum pump (not shown) for evacuating the interior chamber of chamber housing 52. Chamber housing 52 further includes a gas supply conduit 72 controlled by a metering valve 74. A suitable material vaporizing system is provided such as electric filament 64. It being understood that an additional filament 66 and its associated power supply 70 (FIG. 5) may also be utilized in system 120. Filament 64 is preferably positioned closely to the exterior of threaded member 124. Filament 64 is connected to a power source 68. Pipe 122 is rotated utilizing power rollers 130 for rotating pipe 122 in the direction of arrow 132.

A power source 61 is provided to provide a negative DC voltage on pipe 122 for attracting the evaporated material from filament 64 to machined profile 124. In addition, magnet 76 is provided on the interior of pipe 122 adjacent profile 124 to provide a magnetic field 80.

Since it is difficult to insert the ends of pipe 122 into chamber housing 52 and maintain a vacuum in chamber housing 52 for depositing a film of material on profiles 124 and 126 while pipe 122 is being rotated, housing chamber 52 may be provided with a flange mounted appendage 132. Appendage 132 may be divided by utilizing partitions 134, 136 and 138 into a plurality of septum chambers 140, 142 and 144. Partitions 134, 136 and 138 include seal rings 146 which will lightly contact the surface of pipe 122 and which will minimize the leakage of gas between septum chambers 140, 142 and 144 in the interior of the evacuated chamber housing 52.

Septum chamber 144, farthest removed from the chamber housing 52 is slightly pressurized with an inert gas such as, for example, argon, through conduit 148 and a valve 150. Any leakage of the argon from septum chamber 144 through partition 138 will be to the outside air and any leakage through partition 136 will be into septum chamber 142. Septum chamber 142 is connected to a conduit 152 and a valve 154 to a pump (not shown) which pumps at a rate in excess of the leak from septum chamber 144 so that the operating pressure in septum chamber 142 approaches approximately one psia. This arrangement limits the pressure differential that makes a leak possible between septum chambers 144 and 142. In addition, an additional pump (not shown) is connected to a conduit 156 and a valve 158 to septum chamber 140 to maintain the working pressure lower than 1,000 microns. Additional septum chambers may be required which will vary with the roughness of the pipe 122 and the degree of the seal obtained by rings 146. However, with the use of septum chambers 140, 142 and 144, the amount of argon leaking from septum chamber 144 into the evacuated chamber within chamber housing 52 is quite small, and any argon which does leak into chamber housing 52 may be pumped away through conduit 54.

The operation of coating profile 124 assuming that the interior of pipe 122 is blocked is similar to the operation of systems 50 and 90 previously discussed with respect to FIGS. 5 and 6. However, because of the comparitive uncertainty as to the roughness of the pipe 122 surface and possible run-to-run leak rate variation, the actual amount of argon pressure in the chamber of chamber housing 52 during a given process may vary. Therefore it may be necessary to utilize the present process with an independent ionization mechanism of magnetic field 80 such that magnetic field 80 is established in the region about profile 124 where plating is required by the insertion of magnet 76. Therefore, evaporative atoms passing through electrons that are spiraling in the magnetic field 80 become ionized by collision with such electrons and are immediately attracted to the high negative potential on pipe 122 by the power source 61.

It is noted that in the foregoing description of the process, no gas is required to be present for ionization. However, there are instances where the need for film uniformity over very irregular surfaces makes it desirable to add a slight amount of inert gas for the purpose of material scattering to further film uniformity. It should be noted that this use of an inert gas such as for example, argon at a pressure below the typical 10-20 micron pressure needed for ionization is low enough not to adversely affect film properties by inclusion of the gas in the deposited film.

As previously noted, profile 124 is coated in a vacuum. While a plug could be placed in the interior of pipe 122 in order to maintain profile 124 in a vacuum, it is advantageous to coat both profiles 124 and 126 in the same vacuum pump to avoid the expense and time of having to pump pipe 122 to vacuum twice. Therefore, an end cap assembly, generally designated by the numeral 170 allows the deposition of a material film to be done simultaneously on profile 126 with the deposition of a material on profile 124 to take full advantage of the vacuum pumping system in housing chamber 52.

End cap assembly 170 includes a cap piece 172 having a plurality of seals 174, 176 and 178, one of which, such as for example seal 178, seats against the end of pipe 122. Therefore, as vacuum is pumped through the interior of pipe 122, the seal 178 becomes tightly squeezed by the force of atmospheric pressure and the cap 172 will rotate with pipe 122.

A body portion 180 is rotatably mounted in end cap 170 and may be of any suitable plastic of good insulating, low friction and heat resistance such as one sold under the trademark TEFLON. Body portion 180 is gripped by a clamp 181 and is restrained from rotation. A suitable face seal 182 and 0-ring seal 184 prevent leaks. A suitable evaporant such as filament 190 is provided and is connected to a power source 192 through electrical conductors 194 which extend through body 180. A magnet 196 is provided, preferably inside pipe 122, adjacent profile 126 in the region where plating is desired to provide a dense electron cloud for collision ionization. Magnetic force lines 198 from magnets 196 capture electrons which leave the heated filament 190 by thermonic emission. Therefore, atoms of the evaporant are positively ionized in the electron cloud and are accelerated to pipe 122 by the high negative polarity caused by power source 62.

Therefore it can be seen that the present invention provides for a method for resisting galling of threaded members by depositing a material film by high energy level ion plating onto the machined profile of at least one member for providing a thin film on the coacting metal-to-metal surfaces of a pipe.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. A method for resisting galling of coacting threaded members comprising:
    depositing a material film by high energy level ion plating onto the machined profile of at least one member for providing a thin mechanically insulating film on the coacting metal-to-metal surfaces having a low shear stress value thereby separating the coacting metal-to-metal surfaces from each other for preventing galling; and
    rotating at least one of the threaded members during deposition of the film to provide a uniform film.

2. The method of claim 1 wherein the film is from a class including, gold, silver, lead, tin, indium and copper.

3. The method of claim 1 wherein the film is deposited to a thickness in the range of approximately 1,000 angstroms to approximately 1 millimeter.

4. A method for resisting galling of coacting threaded members comprising:
    depositing a material film wherein the material film includes a plurality of layers by high energy level ion plating onto the machined profile of at least one member for providing a thin mechanically insulating film with the inner layer being harder than the outer layer on the coacting metal-to-metal surfaces having a low shear stress value thereby separating the coacting metal-to-metal surfaces from each other for preventing galling.

5. The method of claim 4 wherein the film is from a class including, gold, silver, lead, tin, indium and copper.

6. The method of claim 4 wherein the plurality of layers in total range and thickness ranges from approximately 500 angstroms to approximately 6 millimeters.

7. The method of claim 4 wherein the inner layer film is chromium and the outer layer film is gold.

8. The method of claim 7 wherein the thickness of the chromium film is approximately 2,000 angstroms to approximately 4,000 angstroms and the outer layer of gold is approximately 2,000 angstroms.

9. A method for resisting galling of coacting threaded members comprising:
depositing a material film wherein the film is a layered lattice inorganic compound by high energy level ion plating onto the machined profile of at least one member for providing a thin mechanically insulating film on the coacting metal-to-metal surfaces having a low shear stress value thereby separating the coacting metal-to-metal surfaces from each other for preventing galling.

10. A method for resisting galling of coacting threaded members comprising:
depositing a material film wherein the film is palladium by high energy level ion plating onto the machined profile of at least one member for providing a thin mechanically insulating film on the coacting metal-to-metal surfaces having a low shear stress value thereby separating the coacting metal-to-metal surfaces from each other for preventing galling.

11. The method of claim 10 wherein the film of palladium includes an alloy of palladium.

12. A method for resisting galling of coacting threaded members comprising:
depositing a material film wherein the film is a nickel undercoat covered by an outer layer by high energy level ion plating onto the machined profile of at least one member for providing a thin mechanically insulating film on the coacting metal-to-metal surfaces having a low shear stress value thereby separating the coacting metal-to-metal surfaces from each other for preventing galling.

13. A method for resisting galling of coacting threaded members comprising:
depositing a material film wherein the film is an alloy containing gold and copper by high energy level ion plating onto the machined profile of at least one member for providing a thin mechanically insulating film on the coacting metal-to-metal surfaces having a low shear stress value thereby separating the coacting metal-to-metal surfaces from each other for preventing galling.

14. A method for resisting galling of coacting threaded members comprising:
depositing a material film wherein the film is an alloy containing palladium and copper by high energy level ion plating onto the machined profile of at least one member for providing a thin mechanically insulating film on the coating metal-to-metal surfaces having a low shear stress value thereby separating the coacting metal-to-metal surfaces from each other for preventing galling.

15. A method for resisting galling of coacting threaded members comprising:
depositing a material film wherein the film is an alloy containing palladium and gold by high energy level ion plating onto the machined profile of at least one member for providing a thin mechanically insulating film on the coacting metal-to-metal surfaces having a low shear stress value thereby separating the coacting metal-to-metal surface from each other for preventing galling.

16. A method for resisting galling of coacting threaded members comprising:
depositing a material film wherein the film is an alloy containing palladium and silver by high energy level ion plating onto the machined profile of at least one member for providing a thin mechanically insulating film on the coacting metal-to-metal surfaces having a low shear stress value thereby separating the coacting metal-to-metal surfaces from each other for preventing galling.

17. A method for resisting galling of coacting threaded members comprising:
depositing a material film wherein the film includes a hardened refractory material of metal oxide by high energy level ion plating onto the machined profile of at least one member for providing a thin mechanically insulating film on the coacting metal-to-metal surfaces thereby separating the coacting metal-to-metal surfaces from each other for preventing galling.

18. A method for resisting galling of coacting threaded members comprising:
depositing a material film wherein the film includes a hardened refractory ceramic material by high energy level ion plating onto the machined profile of at least one member for providing a thin mechanically insulating film on the coacting metal-to-metal surfaces thereby separating the coacting metal-to-metal surfaces from each other for preventing galling.

19. The method of claim 18 wherein the ceramic material includes metal carbide.

20. The method of claim 18 wherein the ceramic material includes metal nitride.

21. A method of ion plating both ends of an elongate tubular member comprising:
enclosing each of the ends in a chamber;
evacuating one of the chambers thereby evacuating both chambers through the member;
vaporizing plating material in each of the evacuated chambers adjacent the ends;
applying a direct current negative bias on the member for attracting positive ions of vaporized plating material.

22. The method of claim 21 including, rotating the tubular member.

23. The method of claim 21 wherein the magnetic field is placed adjacent both the ends.

24. The method of claim 21 including:
enclosing portions of the rotating member in septum chambers adjacent one of the evacuated chambers.

25. The method of claim 24, wherein the septum adjacent the evacuated chamber is pumped downwardly, and the septum next away is being supplied with an inert gas.

26. A method of ion plating both ends of an elongate tubular member comprising:
enclosing the first end in a chamber with the second end being positioned out of said chamber;
closing the second end of the member with a rotatable closure;
evacuating the chamber thereby evacuating the area about both the ends;
vaporizing plating material in the evacuated areas adjacent ends; and
applying a direct current negative bias on the member for attracting positive ions of vaporized plating material.

27. The method of claim 26 including: rotating the tubular member.

28. The method of claim 26 including placing a magnetic field adjacent each of the ends of the member.

29. The method of claim 26 in which vaporizing material is within the second end and outside of the first end.

30. The method of claim 28 in which the magnetic field is provided by magnets positioned inside each end of the member.

* * * * *